(12) United States Patent
Lee et al.

(10) Patent No.: US 9,422,191 B2
(45) Date of Patent: Aug. 23, 2016

(54) METHOD OF PREPARING MICRO/NANO HYBRID WOVEN FABRIC SURFACES FOR OIL-OIL FILTRATION OR OIL-WATER FILTRATION

(71) Applicant: KOREA INSTITUTE OF SCIENCE AND TECHNOLOGY, Seoul (KR)

(72) Inventors: Heon Ju Lee, Seoul (KR); Myoung Woon Moon, Seoul (KR); Ji Hyun So, Seoul (KR); Eu Sun Yu, Seoul (KR); Tae Jun Ko, Seoul (KR); Seock Heon Lee, Seoul (KR); Do Hyun Kim, Seoul (KR); Kyu Hwan Oh, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 0 days.

(21) Appl. No.: 14/178,947

(22) Filed: Feb. 12, 2014

(65) Prior Publication Data
US 2015/0225290 A1 Aug. 13, 2015

(51) Int. Cl.
| | |
|---|---|
| C03C 25/68 | (2006.01) |
| B32B 37/00 | (2006.01) |
| C23C 16/26 | (2006.01) |
| C23C 16/505 | (2006.01) |
| D06M 10/00 | (2006.01) |

(52) U.S. Cl.
CPC ............... *C03C 25/68* (2013.01); *C23C 16/26* (2013.01); *C23C 16/505* (2013.01); *D06M 10/00* (2013.01)

(58) Field of Classification Search
CPC .............................. C03C 25/68; D06M 10/00
USPC ............................................................ 216/7
See application file for complete search history.

(56) References Cited

U.S. PATENT DOCUMENTS

| | | | |
|---|---|---|---|
| 2006/0085921 A1 | 4/2006 | Chen et al. | |
| 2011/0045200 A1 | 2/2011 | Hsueh et al. | |
| 2012/0223011 A1* | 9/2012 | Moon et al. | 210/506 |
| 2012/0276335 A1 | 11/2012 | Hong et al. | |
| 2015/0162623 A1 | 6/2015 | Hong et al. | |

FOREIGN PATENT DOCUMENTS

| | | |
|---|---|---|
| KR | 10-2011-0097150 A | 8/2011 |
| KR | 10-2012-0122375 A | 11/2012 |
| WO | 03100156 A1 | 12/2003 |

OTHER PUBLICATIONS

A Communication issued on Jul. 21, 2015 Korean Intellectual Property Office in Counterpart Application No: 10-2014-0014695. Communication corresponds to EP14154675.4.

* cited by examiner

*Primary Examiner* — Roberts Culbert
(74) *Attorney, Agent, or Firm* — Goldilocks Zone IP Law

(57) ABSTRACT

A method to prepare polymer woven fabric surface with selective oleophilicity or hydrophobicity and oil-oil separation and oil-water separation filter prepared by using the surface. The method to prepare the surface with selective oleophilicity or hydrophobicity includes steps comprising a step to form nano meter sized pores on the surface of the polymer woven fabric surface with micro sized pores through drying type etching; and a step to form selective oleophobic or hydrophobic film on the nano meter sized pores. It is possible to control hydrophobic/oleophobic property according to pore size, material or thickness of the film and this polymer surface with hybrid pores can be used in various areas such as an oil filter for car capable of selective separation of oil-oil mixture and water-oil mixture, disposal of waste oil, treatment of marine oil leakage, and pretreatment of crude oil refinement.

9 Claims, 7 Drawing Sheets
(4 of 7 Drawing Sheet(s) Filed in Color)

1 μm

1 μm 1 mm

US 9,422,191 B2

METHOD OF PREPARING MICRO/NANO HYBRID WOVEN FABRIC SURFACES FOR OIL-OIL FILTRATION OR OIL-WATER FILTRATION

RELATED APPLICATION

This application claims the benefit of priority to Korean Patent Application No. 10-2014-0014695, filed on Feb. 10, 2014, which is hereby incorporated by reference for all purposes as if fully set forth herein.

BACKGROUND OF THE INVENTION

1. Field of the Invention

The present invention relates to a method to prepare micro/nano hybrid hydrophobic/oleophobic polymer woven fabric surface and the hydrophobic/oleophobic surface prepared by the method.

More particularly, the present invention a method to prepare micro/nano hybrid hydrophobic/oleophobic polymer woven fabric surface artificially which has much lower wettability, variable contact angle to oil and great contact angle to pure water and the hydrophobic/oleophobic woven fabric surface prepared by the method.

2. Background of the Invention

In general, it is known that wettability of a solid surface depends on chemical features of the surface, but when minute pattern is formed on the solid surface, its wettability increase or decrease remarkably, so its hydrophilicity and hydrophobicity is improved. For example, when minute pillar or pore structures are formed on a flat surface with same chemical composition, the surface shows a trend that when its contact angle to pure water (an angle between fluid and solid equilibrating hydromechanically on the solid surface) is less than 90 degree, it decreases further and when the angle is more than 90 degree, it increases further. Thus, in case of hydrophobicity (contact angle>90 degree), existing 150 degree may increase to 170 degree, showing superhydrophobicity. Accordingly, wettability of the surface decreases remarkably.

For the theory about contact angle of a pure water drop on a fine pillar or pore formed hydrophobic surface, namely a surface with roughness, 2 models are known. One is a model with completely wet area under the water drop supposed by Wenzel [R. N. Wenzel, Ind. Eng. Chem. 28(1936)988], which is a theory that the roughness on the surface results in increase of apparent contact angle by increasing contact area between solid and water drop (fluid). The other one is a theory supposed by Cassie-Baxter [A. B. D. Cassie, S. Baxter, S. Trans. Faraday Soc. 40(1944)546], proposing that air is trapped between the rough surface and water drop and the shape of water drop placed on the air increases the contact angle.

Thus, in order to prepare a hydrophobic or superhydrophobic surface, a surface layer with chemically low surface energy should be formed and surface roughness should exist concurrently. It is suggested that for the surface roughness, distribution of fine pillar or pore size plays a considerably important role. Especially, a structure like a lotus leaf having nano sized roughness on micro sized roughness is suggested. It is reported that on the lotus leaf, both micro scale pillars (bump) and nanometer scale pillars (nanopillar) exist and at the same time, a chemical like wax having low surface energy is distributed to maintain its superhydrophobicity. In addition, recessed pore like structure well as this prominent shaped roughness shows similar features. Especially, when the pore size is hybrid of nano and micro scale and chemical composition of the surface is adjusted, it is possible to form hydrophobic, further even superhydrophobic surface.

SUMMARY OF THE INVENTION

For general filters, their flux to be purified is determined by pore size, surface energy, porosity, and tortuosity, wherein the pore size and the surface energy determine target fluid type to be filtered. For woven fabric filters, their transmissible fluid type is determined by a certain size of pore and surface energy of fabric. The inventors identified that it was possible to change the transmissibility with only existence of nano structure even in same material and same pore size by adjusting hydrophobicity/hydrophilicity from the above mentioned nanostructure.

Accordingly, an objective of the present invention is to provide a method to prepare a woven fabric filter surface capable of oil-oil filtration for specific materials as well as oil-water filtration by granting selective hydrophobicity/oleophobicity from nano structure formed on woven fabric filter with micro pores and the woven fabric filter prepared by the method.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

The patent or application file contains at least one drawing executed in color. Copies of this patent or patent application publication with color drawing(s) will be provided by the Office upon request and payment of the necessary fee.

In the Drawings:

FIG. 1a is a schematic diagram of woven fabric filters having micro sized pores.

FIG. 1b is a schematic diagram showing transmittance of a filter without nano structure and hydrophobic/oleophobic treatment to a certain fluid.

FIG. 1c is a schematic diagram showing that the fluid which had been transmitted is not transmitted after nano structure and hydrophobic/oleophobic treatment.

FIG. 1d is a schematic diagram showing that the woven fabric filter in the above FIG. 1c can transmit another fluid.

FIG. 1e is a schematic diagram showing that for the mixture of 2 fluids illustrated in the above FIGS. 1c and 1, oil-oil filtration is enabled by using the woven fabric filter treated with nano structure and hydrophobicity/oleophobicity.

FIGS. 2a and 2b is a SEM (Scanning Electron Microscope) image of an woven fabric surface before and after nano structure hydrophobic/oleo phobic treatment to explain a surface with hybrid pores according to an example of the present invention.

FIG. 3a is an image of polyethylene surface with micro pores before plasma etching and FIG. 3b is an image of the surface etched by using $O_2$ plasma on −400Vb of voltage.

FIG. 4 shows that hydrophobicity/oleophobicity on the surface can be adjusted selectively as change of contact angle to pure water at different $HMDSO/O_2$ fraction.

FIG. 5a is an image of surface after hydrophobic coating on polyethylene woven fabric surface with micro pores and contact state of water drop on the surface.

FIG. 5b is an image of surface after hydrophobic coating on a polyethylene woven fabric surface with micro pores and contact state of ethylene glycol on the surface.

FIG. 5c is an image of surface after hydrophobic coating on a polyethylene woven fabric surface with micro pores and contact state of silicon oil drop on the surface.

DETAILED DESCRIPTION OF THE INVENTION

Figure 1A:
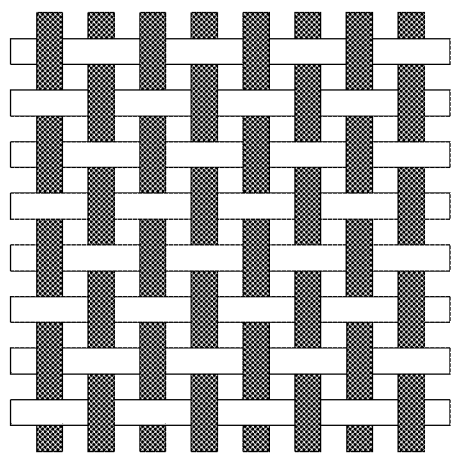
Figure 1B:
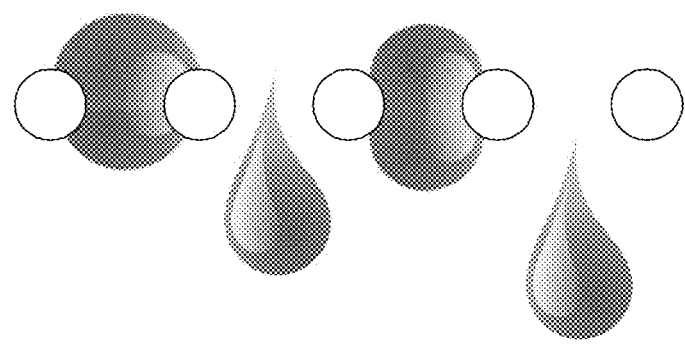
Figure 1C:
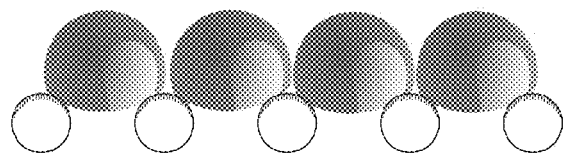
Figure 1D:
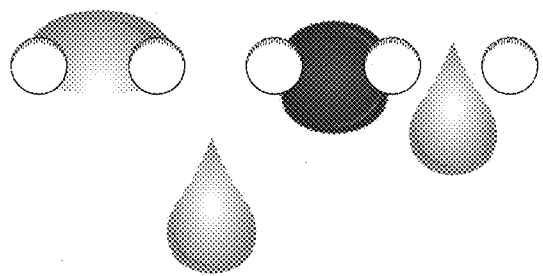
Figure 1E:
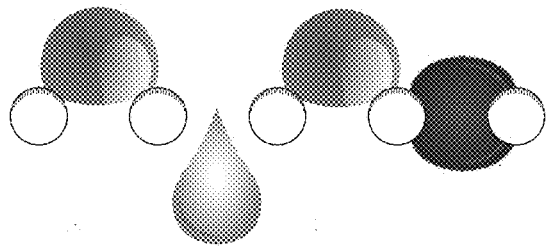

An objective of the present invention is to provide a method to prepare a hydrophobic or superhydrophobic woven fabric surface with hybrid pores comprising: (i) a step to form micro-nano hybrid pore structure by making nano meter sized pores with plasma etching on the micro sized pores; and (ii) a step to form hydrophobic film on the above micro-nano hybrid structure.

The above fabric used in the present invention is a woven fabric.

Because a densely woven fabric has wide gap and is wetted with and transmits droplets easily, most studies has performed on oil-water filters using spun fabric or non-woven fabric with tight gaps.

However, the inventors found that the densely woven non-woven fabric is likely to occur fouling, develop blocking during treating contaminated water, and has smaller processable flux due to coexistence of proper sized pores and smaller than proper sized pores and not densely woven fabric has much lower filter performance due to coexistence of larger than proper sized pores.

In this situation, the inventors of the present invention identified that it was possible to grant homogeneous nano structure on the woven fabric surface which transmits droplets well due to large gap and perform oil-water filtering in spite of large gaps of the woven fabric by adjusting surface energy in coating and completed this invention by identifying that it was possible to accomplish effects that the non-woven fabric did not have due to the homogeneous nano structure, including not only oil-water filtering with large flux but also oil-oil filtration effect for specific materials by optimization of filter performance by size controlling of the pores depending on fluid mixture to be filtered.

In addition, the present invention has a merit that it can be applied to various clothing, diaper, sanitary napkin, and filter because it is applicable to various woven fabrics including natural fabrics such as cotton and silk as well as polymeric artificial fabrics, in comparison with existing surface treatment on filter membrane in form of spun or non-woven fabric.

The woven fabrics applicable to the method of present invention included at least one polymeric woven fabric selected from the group comprising PP (polypropylene), nylon 6, nylon 66, PC (polycarbonate), PI (polyimide), PS (polystyrene), PE (polyethylene), PMMA (Poly(methyl methacrylate)), PDMS (Polydimethylsiloxane), PLGA (poly (lactic-co-glycolic) acid), hydrogel, PET (polyethylene terephthalate), silicon rubber, PC/ABS (polycarbonate/acrylonitrile butadiene styrene), PC/SAN (polycarbonate/styrene acrylonitrile), and PC/PBT (polycarbonate/polybutylene terephthalate).

In the method of present invention, etching can be performed by plasma etching using $O_2$ gas.

In addition, the etching can be performed 1 Pa~10 Pa of etching pressure and −100Vb~−1000Vb of voltage condition.

Size of nano pore formed by the above etching may have 1~1000 nm of diameter.

In the method of present invention, hydrophobic thin film formed on micro-nano hybrid pore structure may include amorphous carbon film (a-C:H:Si:O) containing silicon and oxygen formed through PECVD (Plasma-enhanced chemical vapor deposition) method, And, the step to prepare the hydrophobic thin film can be performed under 2 Pa~10 Pa of pressure by using gas containing hexamethyldisiloxane (HMDSO) or gas mixture including hexamethyldisiloxane (HMDSO) with 10~30% of oxygen fraction.

The hydrophobic thin-film can be controlled to have selective oil absorbability by adjusting ratio between HMDSO and oxygen.

In addition, size and shape of the above nano pore can be controlled by changing at least one selected from the group comprising irradiation time and acceleration voltage of the plasma in plasma etching.

Contact angle to pure water of superhydrophobic surface prepared by the method of present invention is at least 150 degree.

Another objective of the present invention is to be accomplished by hydrophobic or superhydrophobic surface featured by including nano meter sized pores formed on polymeric woven fabric surface with micro sized pores and hydrophobic film covering up micro/nano sized pores on the polymeric surface.

Diameter of the above nano meter sized pores may be 1 nm~1000 nm.

And the hydrophobic thin-film may be amorphous carbon film containing silicon and oxygen (a-C:H:Si:O) with 1 nm~100 nm of thickness.

Hereinafter, the method to prepare hydrophobic surface and the hydrophobic surface prepared by the method will be described as with reference to the drawings.

The present invention relates to a technology to form hydrophobic/superhydrophobic surface with at least 150 degree of contact angle to fluid like pure water by forming nano meter sized pores on the polymeric filter with several tens and hundreds micrometer (μm) sized pores and hydrophobic thin-films on nano/micro hybrid surface and a superhydrophobic surface prepared by the technology.

Particularly, as shown in the FIG. 1, nano-meter sized pores are formed on woven fabrics with micro meter sized pore, for example. Using plasma etching on the PET filter surface. The etching may be plasma etching using only $O_2$ as gas. Accordingly, a micro/nano hybrid pore formed surface is prepared by forming nano-meter sized pores on the surface of woven fabric with existing micro meter sized pores. Because this surface prevents transmission of fluid which could be transmitted prior to the surface treatment and selective filtering is possible like FIG. 1e.

Figure 2A:
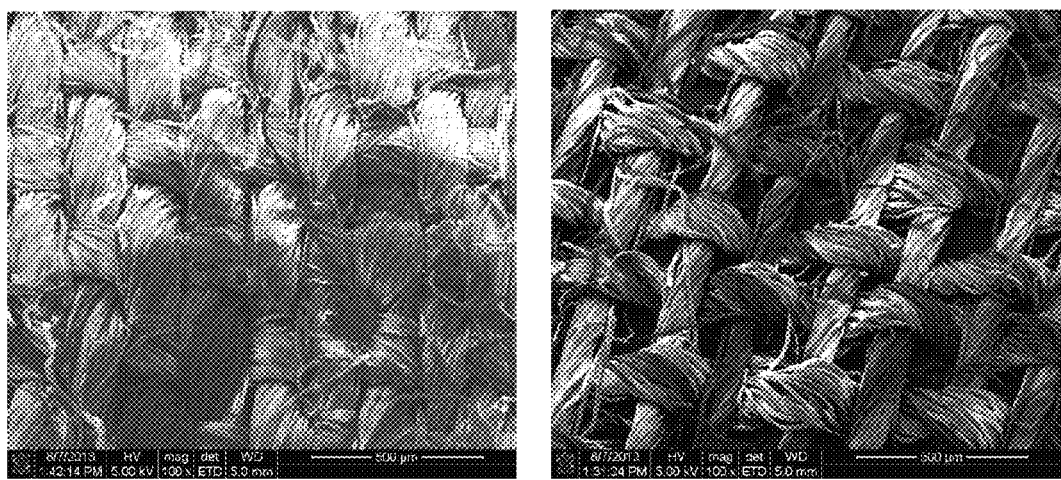
Figure 2B:
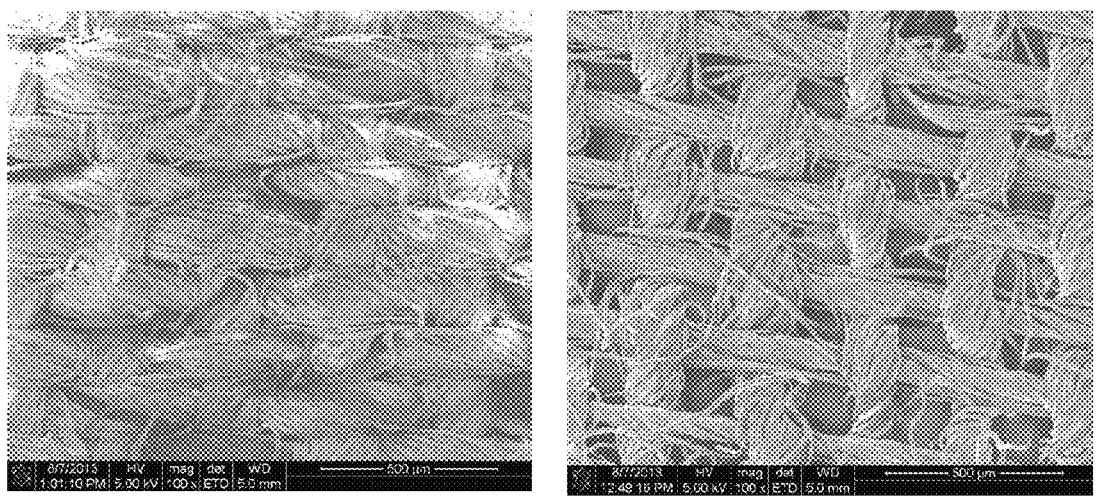
Figure 3A:
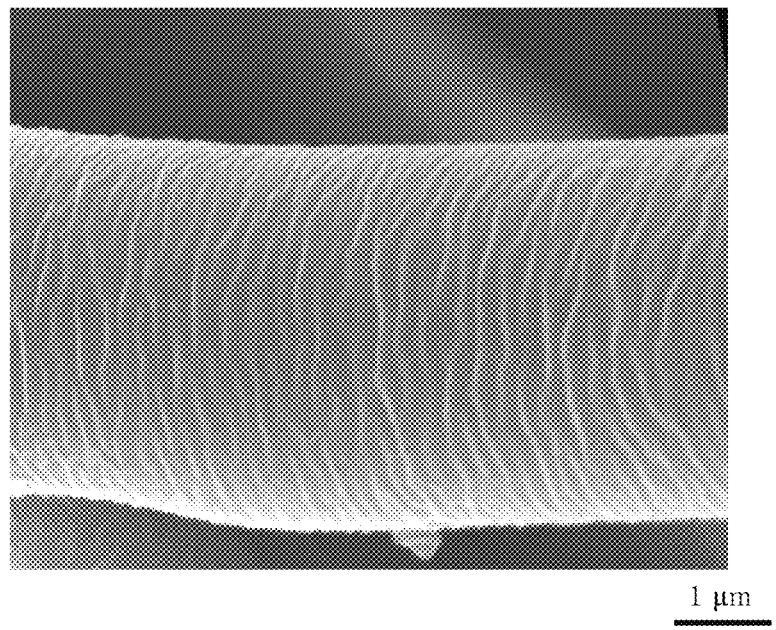
Figure 3B:
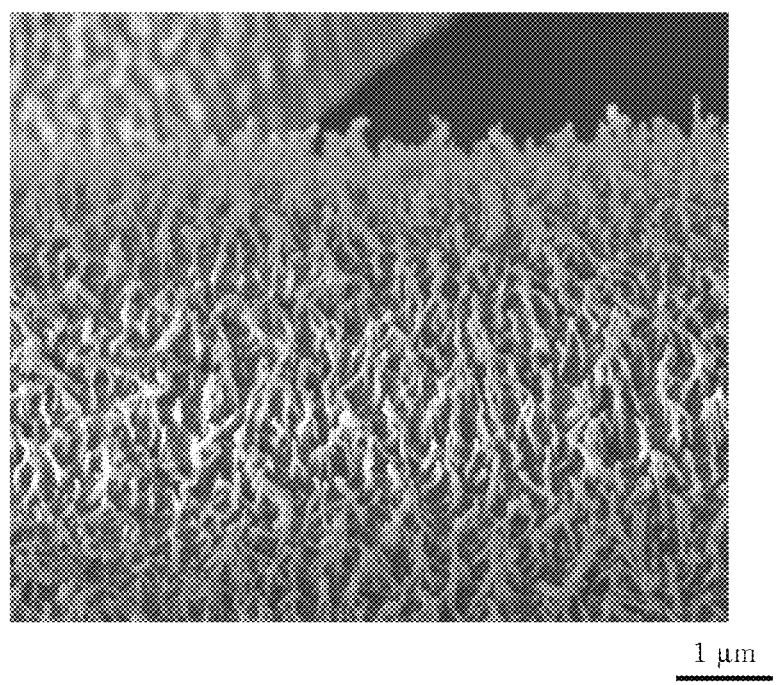

At this point, when etching a polymeric woven surface with micro sized pores through plasma etching, it is suggested that a number of nano sized pores are formed when magnifying the etched micro structure part (FIG. 2b).

Then, a hydrophobic thin film is formed on the surface of micro/nano hybrid polymer surface. The hydrophobic thin film may be amorphous carbon film containing silicon and oxygen (a-C:H:Si:O) formed through PECVD (plasma enhanced chemical vapor deposition) method.

Through this process, a material having hydrophobic or superhydrophobic surface (superhydrophobic surface body) is completed. Contact angle of the superhydrophobic surface prepared by this method is at least 150 degree.

Accordingly, the woven fabric filter of the present invention can perform filtration of desired mixture effectively, by adjusting selective superhydrophobic/superoleophobic surface through size of the woven fabric, material of spinning thread, and existence of nano structure.

As explained in the above, the present invention provides a method to prepare superhydrophobic polymer woven fabric filter surface with large contact angle.

The filter prepared by the method can be used in various areas including oil-oil filtration filter, desalination filter, pretreatment of crude oil refining as well as oil-water filtration filter, because it can have selective oleophilicity to special oil. Degree of hydrophobicity can be controlled by size of micro pores, existence of nano structure, and composition of the coating film, through which selective oleophilicity can be given.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

EXAMPLE

Preparation of Hydrophobic or Superhydrophobic Surface Body where Hydrophobic Thin Film is Formed on Nano/Micro Hybrid Pore Structure (1) Formation of Nano Pores on the Micro Surface and Between Pores of Fabric First, nano pores were formed on the surface with micro meter sized pores with below method.

First of all, Polyethylene terephthalate (PET) woven fabric with 1~100 micro meter sized pores was prepared. The surface shape prior to plasma etching was shown in FIG. 2a.

The PET surface with micro meter sized pores was etched with $O_2$ plasma etching using r.f. PECVD. At this times, only $O_2$ was used as gas and the $O_2$ plasma etching was performed in condition of 1 Pa~10 Pa of etching pressure and −100Vb~−1000Vb of r.f. voltage. Accordingly, as shown in FIG. 2b, it was found that multiple nano pores with about 50 nm in diameter on the micro sized pore surface and between micro pores were formed.

(2) Formation of Hydrophobic Thin Film

A method to prepare hydrophobic thin film on the micro/nano hybrid pore formed polyethylene is described. For hydrophobic thin film, amorphous carbon film containing silicon and oxygen (a-C:H:Si:O) was formed through PECVD method. This hydrophobic thin film was deposited using HMDSO (hexamethyldisiloxane) and $O_2$ gas by 13.56 Mhz r.f. PACVD. At this time, r.f. power was fixed as −400Vb. The hydrophobic film was deposited as 10 nm, 50 nm, and 100 nm in thickness and the used pressure was 20 mTorr. It was identified that the surface property of this prepared hydrophobic surface depended on r.f. power and $O_2$ fraction in leading gas. Thus, it is possible to deposit hydrophobicity improved film by adjusting r.f. power and $O_2$ fraction in leading gas properly.

Besides, the $O_2$ fraction can be changed to obtain alteration of process condition and desired surface property of hydrophobic thin film.

Accordingly, a body with hydrophobic or superhydrophobic surface (superhydrophobic surface body) where hydrophobic thin film was formed on nano/micro hybrid pore structure was completed.

As described in the above mentioned preparing method, it was found that the diameter of nano pores was 1 nm~1000 nm.

Property Measurement of the Above Prepared Hydrophobic or Superhydrophobic Surface Body Hereinafter, a method to measure properties of the above prepared surface body with hybrid pores and results are described concretely.

Contact angle was measured using Goniometer (Data Physics instrument Gmbh, OCA 20L). This equipment allows measurement of optical image and contact angle of sessile droplet on the surface. Static contact angle was measured by gentile landing of 5 ml droplet on the surface.

Figure 5A:
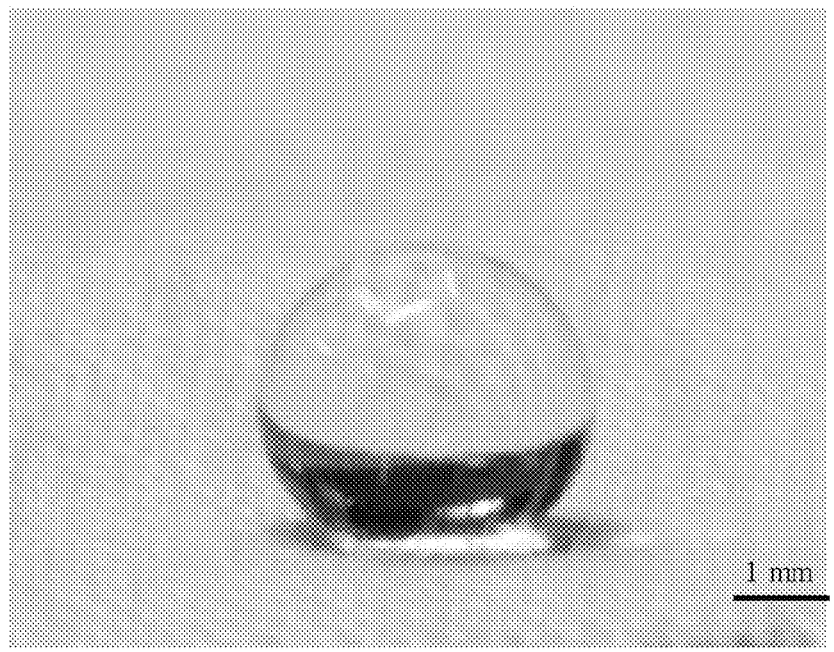

FIG. 5a shows an image of contact angle to pure water on the PET woven fabric where hybrid pores and hydrophobic film prepared in the example of the present invention were formed. The static contact angle was measured as about 150 degree.

Figure 5B:
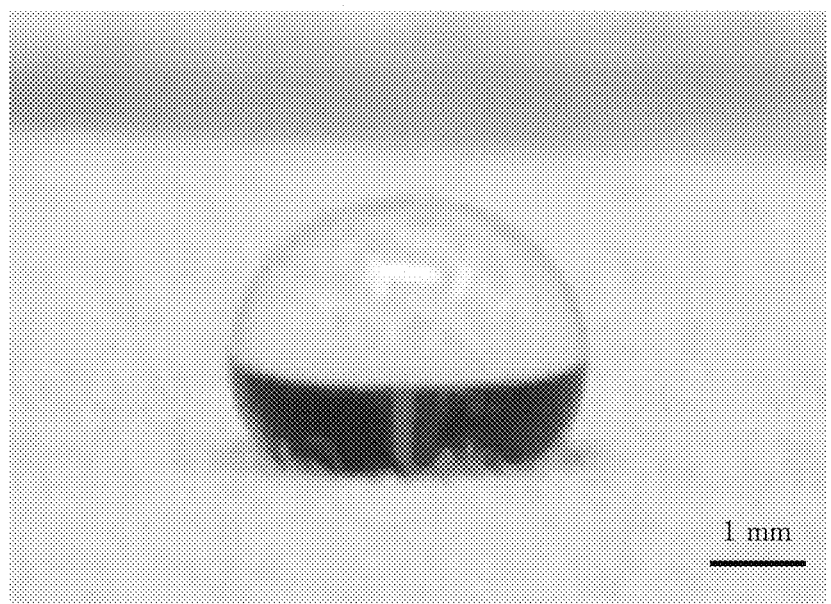

FIG. 5b is an image of ethylene glycol on the PET woven fabric where hybrid pores and hydrophobic film prepared in the example of the present invention were formed. It was found that the contact angle was about 140 degree.

Figure 5C:
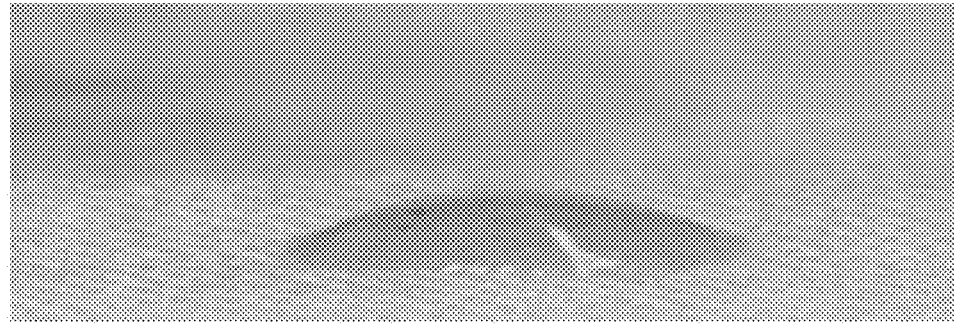
Figure 5C:
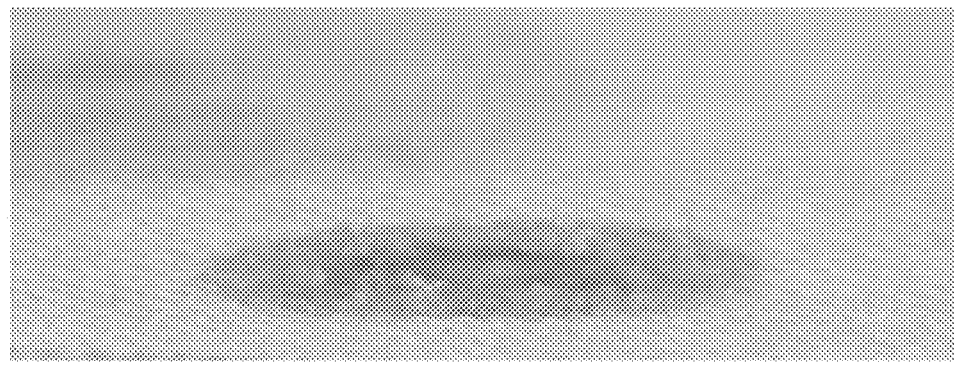
Figure 5C:

FIG. 5c is an image of silicon oil on the PET woven fabric where hybrid pores and hydrophobic film prepared in the example of the present invention were formed. It was suggested that when a hydrophobic film (a-C:H:Si:O film) was coated on the nano structure formed after drying type etching on the PET filter surface with micro pores, all the solution was absorbed into the woven fabric.

Figure 4:
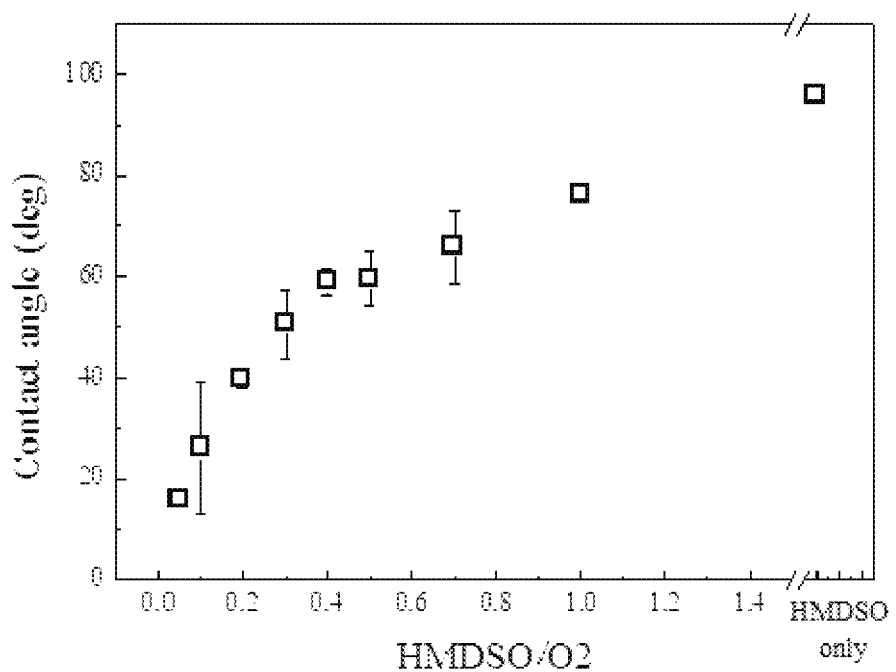

Results from the above mentioned experiment (FIG. 5) are as follows. It was confirmed that the contact angle to pure water was measured larger on the surface with micro/nano sized hybrid pores or roughness than hydrophobic film coated surface with micro sized pores. In addition, it was identified that while the silicon oil was absorbed into the surface, the ethylene glycol was not absorbed into and stayed on the surface. Because the contact angle to oil was altered depending on the material of hydrophobic film (fraction between oxygen and HMDSO), it was suggested that preparation of oil-oil filter with oleophilic/oleophobic property was possible (FIG. 4). FIG. 5 showed that the hydrophobic or superhydrophobic surface body where hydrophobic film was formed on the nano/micro hybrid structure prepared in the present invention can be used as an woven fabric filter applicable to separation of a mixture of ethylene glycol and silicon oil or a mixture of water and silicone oil.

COMPARATIVE EXAMPLE

Comparative Example 1

As described in Example except using non-woven fabric prepared by spinning method instead of the PET woven fabric, nano pores were prepared on the surface of non-woven fabric and then the hydrophobic film was deposited using deposition method with HMDSO (hexamethyldisiloxane)/$O_2$ gas. Then, a wetting experiment for ethylene glycol and silicon oil was performed.

As results of the experiment, it was found that when using the loosely spun non-woven fabric, the performance of filter was lowered remarkably and could not perform the oil-water and oil-oil separation. It was considered that it was because larger pores than desired size coexisted due to inconsistency of pores of non-woven fabric.

On the contrary, it was identified that when using densely spun non-woven fabric, the performance of the filter was lowered remarkably and the filter got clogged during treatment of contaminated water, due to coexistence of smaller pores than desired size (inconsistency of pores).

Comparative Example 2

In preparing nano pores on the micro surface of PET woven fabric and between micro pores, the PET surface with micro meter sized pores was etched under argon gas atmosphere through plasma etching.

In preparing hydrophobic film on the above pore etched PET surface, the hydrophobic film was deposited using gas mixture containing $C_2F_6$ and $CH_4$ as 1:1 ratio instead of HMDSO/$O_2$ and then the wetting experiment for ethylene glycol and silicon oil was performed.

As results of the experiment, it was identified that as the above surface body did not transmit water molecule but transmitted the ethylene glycol oil and silicon oil, so it had a function as oil-water separation filter. However, as it could not separate the ethylene glycol oil and silicon oil, it was impossible to use it as oil-oil separation filter.

What is claimed is:

1. A method of preparing a hydrophobic or superhydrophobic woven fabric surface having hybrid pores comprising:
   preparing micro-nano hybrid pore structure by forming nano sized pores on the surface of the woven fabric having micro sized pores by plasma etching; and
   forming hydrophobic film on the micro-nano hybrid pore structure prepared in the preparing micro-nano hybrid pore structure,
   wherein the hydrophobic film is amorphous carbon thin film containing silicon and oxygen (a-C:H:Si:O) formed through plasma-enhanced chemical vapor deposition (PECVD) method, and
   the forming hydrophobic film is carried out using a gas mixture comprising hexamethyldisiloxane (HMDSO) and oxygen with an oxygen fraction of 10 to 30%.

2. The method according to claim 1, wherein the etching onto the surface of the woven fabric is carried out by plasma etching using $O_2$ gas.

3. The method according to claim 2, wherein the etching is carried out under a etching pressure of 1 to 10 Pa and voltage condition of −100 to −1000 Vb.

4. The method according to claim 1, wherein the diameter of nano pores is 1 nm to 1000 nm.

5. The method according to claim 1, wherein the step of forming the hydrophobic thin film is carried out under a pressure of 1 to 10 Pa.

6. The method according to claim 1, wherein the surface energy of the hydrophobic thin-film can be controlled to have selective oil absorbability by adjusting ratio between HMDSO and oxygen.

7. The method according to claim 1, wherein the hydrophobic or superhydrophobic woven fabric surface has at least 150 degree of contact angle.

8. The method according to claim 1, wherein the size and shape of the above nano pore can be controlled by changing at least one selected from plasma irradiation time and acceleration voltage in carrying out plasma ething.

9. The method according to claim 1, wherein the woven fabric includes at least one polymeric woven fabric selected from the group consisting of PP (polypropylene), nylon 6, nylon 66, PC (polycarbonate), PI (polyimide), PS (polystyrene), PE (polyethylene), PMMA (Poly(methyl methacrylate)), PDMS (Polydimethylsiloxane), PLGA (poly(lactic-co-glycolic) acid), hydrogel, PET (polyethylene terephthalate), silicon rubber, PC/ABS (polycarbonate/acrylonitrile butadiene styrene), PC/SAN (polycarbonate/styrene acrylonitrile), and PC/PBT (polycarbonate/polybutylene terephthalate).

* * * * *